United States Patent
Peng et al.

(10) Patent No.: US 11,538,751 B2
(45) Date of Patent: Dec. 27, 2022

(54) INDUCTOR CAPACITOR FILTER IN FAR BACK END OF LINE AND INTEGRATION SCHEMES

(71) Applicant: GLOBALFOUNDRIES Singapore Pte. Ltd., Singapore (SG)

(72) Inventors: Lulu Peng, Singapore (SG); Nur Aziz Yosokumoro, Singapore (SG); Zishan Ali Syed Mohammed, Singapore (SG); Lawrence Selvaraj Susai, Singapore (SG); Chor Shu Cheng, Singapore (SG); Yong Chau Ng, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 210 days.

(21) Appl. No.: 17/010,841

(22) Filed: Sep. 3, 2020

(65) Prior Publication Data

US 2022/0068809 A1   Mar. 3, 2022

(51) Int. Cl.
   *H01L 23/522* (2006.01)
   *H01L 49/02* (2006.01)
(52) U.S. Cl.
   CPC ...... *H01L 23/5227* (2013.01); *H01L 23/5223* (2013.01); *H01L 28/10* (2013.01); *H01L 28/40* (2013.01)

(58) Field of Classification Search
   CPC . H01L 23/5227; H01L 23/5223; H01L 28/10; H01L 28/40; H01L 29/66181; H01L 29/945
   See application file for complete search history.

(56) References Cited

U.S. PATENT DOCUMENTS

| | | | |
|---|---|---|---|
| 6,362,012 B1 | 3/2002 | Chi et al. | |
| 6,998,696 B2 | 2/2006 | Casper et al. | |
| 8,405,135 B2 | 3/2013 | Yang et al. | |
| 8,809,951 B2 | 8/2014 | Lin et al. | |
| 9,369,927 B2 | 6/2016 | Su et al. | |
| 10,292,269 B1 | 5/2019 | Mudakatte et al. | |
| 2002/0123159 A1* | 9/2002 | Chi | H01L 27/08 257/E21.022 |
| 2004/0145855 A1* | 7/2004 | Block | H01L 23/5286 257/E21.018 |

* cited by examiner

*Primary Examiner* — Nelson Garces
(74) *Attorney, Agent, or Firm* — Anthony Canale

(57) ABSTRACT

A semiconductor device is provided. The semiconductor device comprises an inductor in a far back end of line layer and a capacitor adjacent to and electrically coupled with the inductor. The capacitor comprises a first electrode layer arranged over sidewalls and a bottom surface of a via in a first insulating layer A dielectric layer is provided over the first electrode layer. A second electrode layer is provided over the dielectric layer and a metal fill layer is provided over the second electrode layer. The metal fill layer has a top surface at least level with a top surface of the first insulating layer.

20 Claims, 10 Drawing Sheets

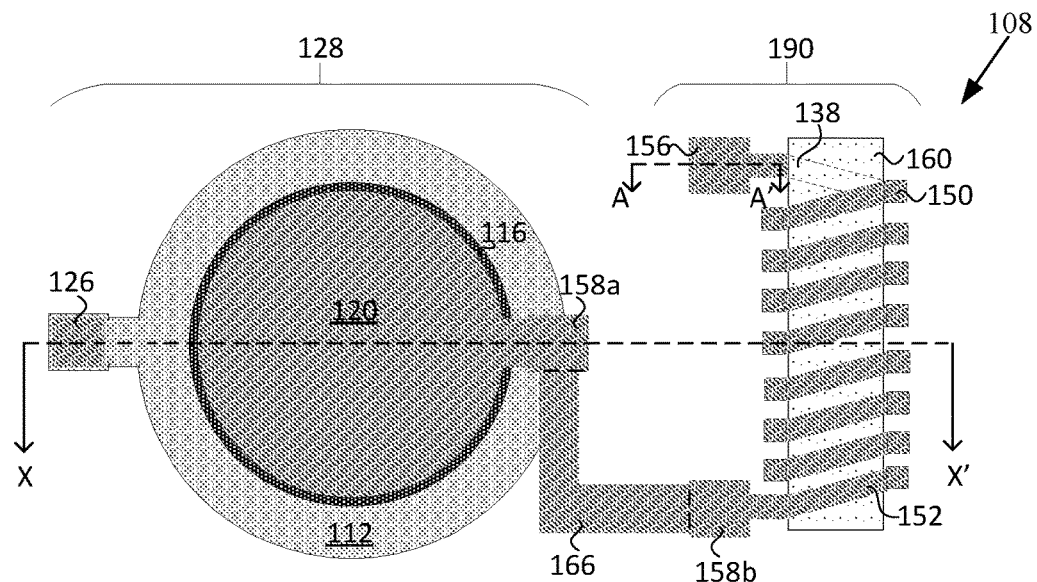
FIG. 1C
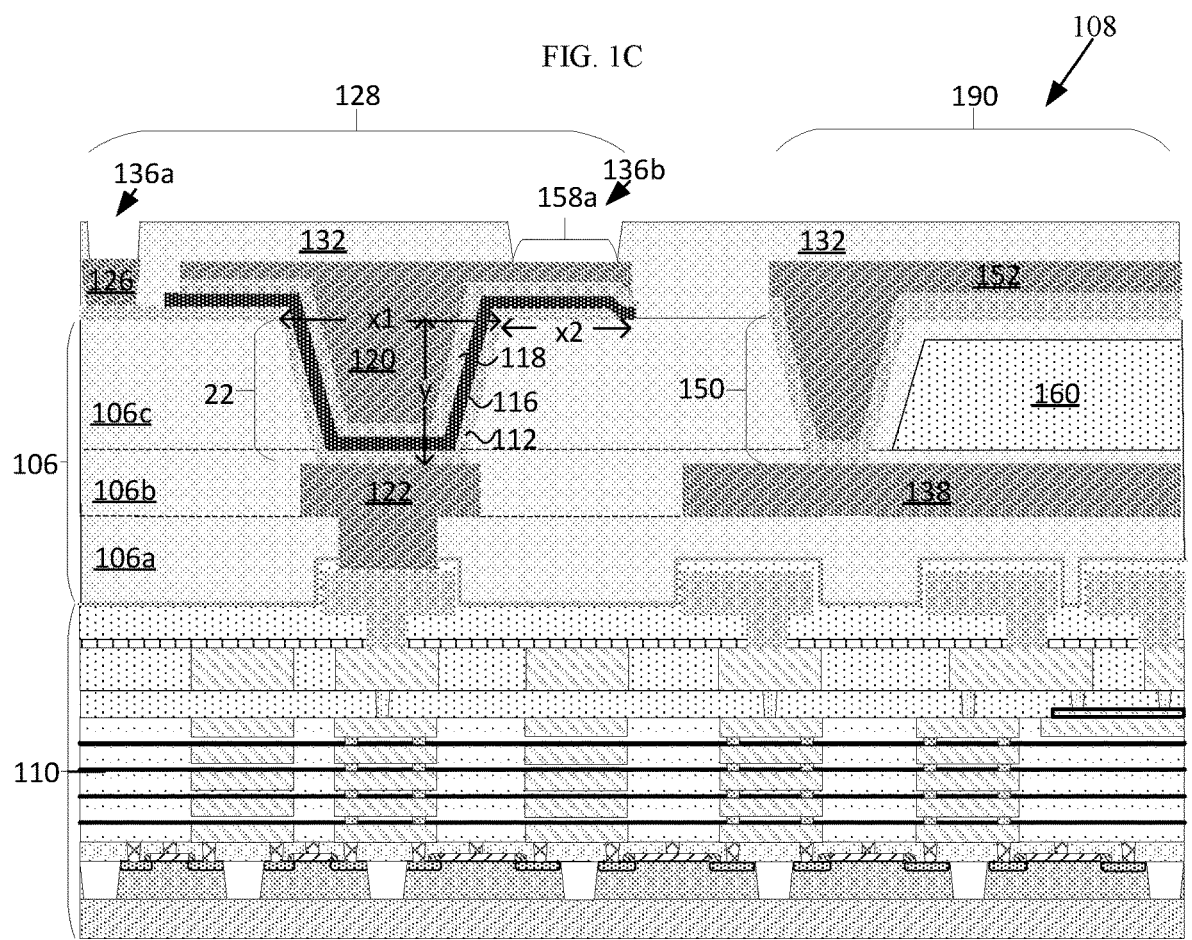
X-X'  FIG. 1D

INDUCTOR CAPACITOR FILTER IN FAR BACK END OF LINE AND INTEGRATION SCHEMES

FIELD OF THE INVENTION

The disclosed embodiments relate generally to semiconductor devices, and more particularly, to an inductor capacitor filter in far back end of line (far BEOL) with high density and integration schemes thereof.

BACKGROUND

An inductor capacitor (LC) filter device includes an inductor and a capacitor having a common node. A load resistor may be connected to the common node and to a ground terminal. The LC filter may be used as a low pass filter with a node of the capacitor connected to the ground terminal or as a high pass filter with a node of the inductor connected to the ground terminal. The term "low pass filter" may refer to a filter that allows signals with a frequency lower than a cut off frequency to pass. The term "high pass filter" may refer to a filter that allows signals with a frequency higher than a cut off frequency to pass.

Current wafer level LC filter devices have low density capacitance with less than a few nano Farad per mm square ($nF/mm^2$) and inductance of less than a few nano Henry per mm square ($nH/mm^2$). The low density capacitance and inductance is not suitable for low frequency applications such as power management in mobile devices. Discrete inductors and capacitors which are not integrated into the semiconductor chip may have higher capacitance and inductance values, respectively but they are bulky and expensive. Thus, there is a need for an improved LC filter device to overcome the challenges mentioned above.

SUMMARY

In an aspect of the present disclosure, a semiconductor device is provided. The semiconductor device comprising an inductor in a far BEOL layer, and a capacitor adjacent to and electrically coupled to the inductor. The capacitor comprises a first electrode layer arranged over sidewalls and a bottom surface of a via opening in a first insulating layer, a dielectric layer over the first electrode layer, a second electrode layer over the dielectric layer, a metal fill layer over the second electrode layer, whereby the metal fill layer has a top surface at least level with a top surface of the first insulating layer.

In another aspect of the present disclosure, a semiconductor device is provided. The semiconductor device comprising an inductor in a far BEOL layer, and a capacitor adjacent to and electrically coupled to the inductor. The capacitor comprises a first electrode layer arranged over sidewalls and a bottom surface of a via opening in a first insulating layer, the first electrode layer extends over at least a portion of a top surface of the first insulating layer, a dielectric layer over the first electrode layer, a second electrode layer over the dielectric layer, and a metal fill layer over the second electrode layer, the metal fill layer having a top surface at least level with a top surface of the second electrode layer over the first insulating layer.

In yet another aspect of the present disclosure, a method of fabricating a semiconductor device is provided. The method comprises forming an inductor in a far BEOL layer, and forming a capacitor adjacent to and electrically coupled to the inductor. The formation of the capacitor comprises providing a first electrode layer over sidewalls and a bottom surface of a via opening in a first insulating layer, providing a dielectric layer over the first electrode layer, providing a second electrode layer over the dielectric layer and providing a metal fill layer over the second electrode layer, whereby the metal fill layer has a top surface at least level with a top surface of the first insulating layer.

Numerous advantages may be derived from the embodiments described below. The embodiments may provide an inductor capacitor filter with a high capacitance density of at least 100 $nF/mm^2$ and a high inductance density of at least 100 $nH/mm^2$. The inductor capacitor filter is integrated into a semiconductor chip in the far BEOL layer thereby providing a compact and cost-effective solution suitable for low frequency applications of less than 50 MHz including power management in mobile devices.

BRIEF DESCRIPTION OF THE DRAWINGS

The disclosed embodiments will be better understood from a reading of the following detailed description, taken in conjunction with the accompanying drawings:

FIG. 1C is a top view of an inductor capacitor filter, according to an embodiment of the disclosure.

FIG. 1D is a cross-section view of an inductor capacitor filter taken along section line X-X' of FIG. 1C, according to an embodiment of the disclosure.

Figure 1A:
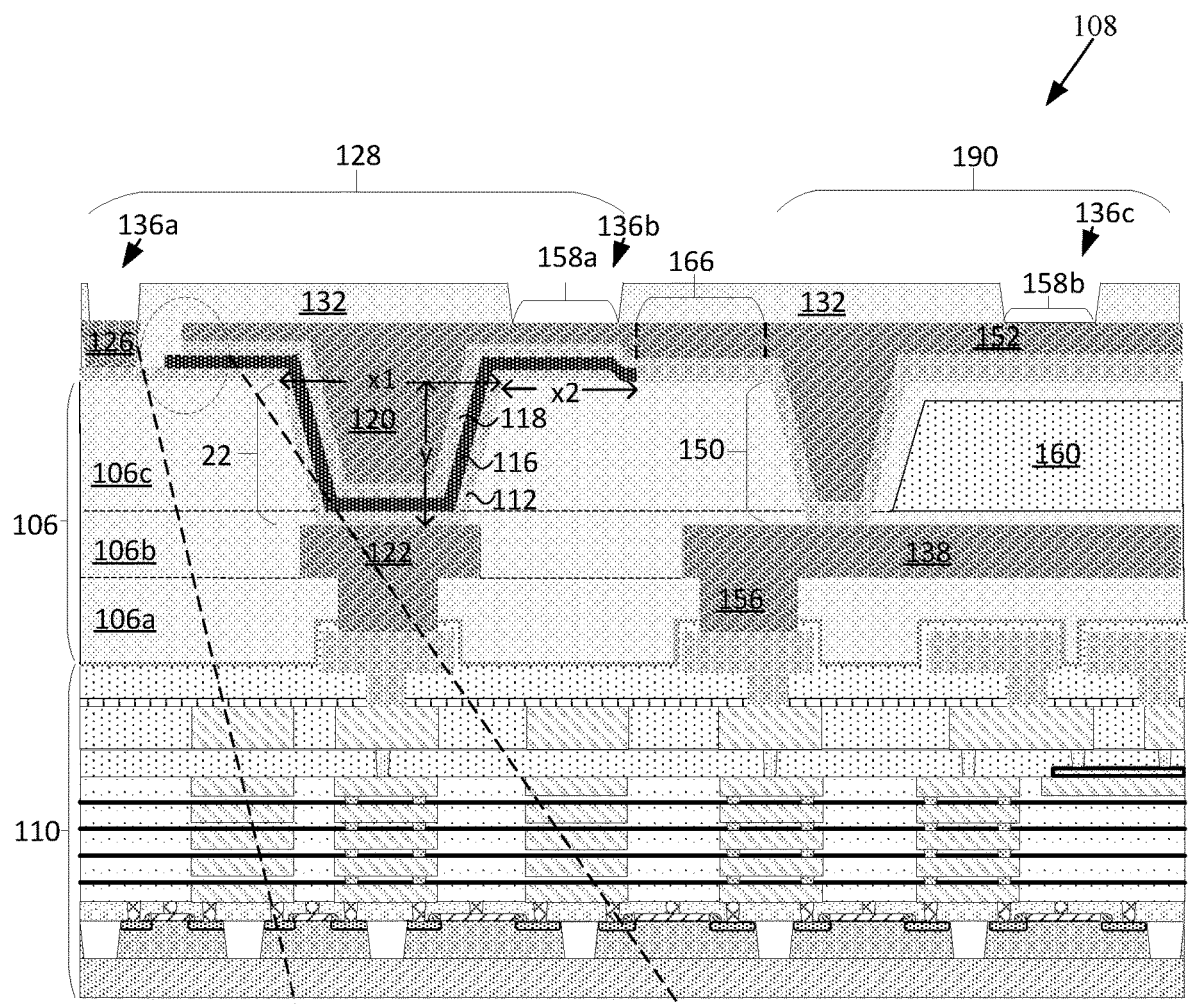
FIG. 1A is a schematic view of an inductor capacitor filter, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a schematic view of a semiconductor device 108, according to an embodiment of the disclosure. The semiconductor device 108 illustrated in FIG. 1A may be an inductor capacitor filter or an impedance matching network.

The inductor capacitor filter 108 may comprise a capacitor 128 which is adjacent to and is electrically coupled to an inductor 190 and are provided in a far BEOL layer. An integrated circuit 110 comprising transistors and multiple BEOL layers may be provided below the inductor capacitor filter 108. The term "far BEOL" may refer to a portion of a semiconductor processing that creates a metal layer (e.g., the under-bump-metal or redistribution layer) and associated interconnect structures forming a connection between on-chip and off-chip wiring. The term "BEOL" may refer to a portion of a semiconductor processing that creates conductive lines carrying power and signals between devices such as transistors to a semiconductor chip interface.

Referring to FIG. 1A, the capacitor 128 may comprise a first electrode layer 112 arranged over sidewalls and a bottom surface of a via 22 in a first insulating layer 106. The via 22 is arranged over a first metallization structure 122. A dielectric layer 116 may be provided over the first electrode layer 112. A second electrode layer 118 may be provided over the dielectric layer 116. A metal fill layer 120 may provided over the second electrode layer 118, whereby the metal fill layer 120 completely fills up the via 22. In one embodiment, a top surface of the metal fill layer 120 may be at least level with a top surface of the first insulating layer 106. In further embodiments, the top surface of the metal fill layer 120 may be higher than the top surface of the first insulating layer 106. In one embodiment, the via 22 may have a height y of between 20 to 50 micrometers (µm). In another embodiment, the via 22 may have an upper diameter x1 of at least 50 micrometers (µm). The term "metal fill" may refer to a conductive material providing a low contact resistance. For example, the metal fill layer 120 provides a low contact resistance for the capacitor 128.

The first electrode layer 112 of the capacitor 128 may extend over at least a portion of a top surface of the first insulating layer 106. For example, the width of the first electrode layer 112 may be wider than the upper diameter x1 of the via 22. For example, the portion of the top surface of the first insulating layer 106 has a length x2 with a range between 5 to 50 micrometers (µm). A first end portion of the dielectric layer 116 may extend over a first end portion of the first electrode layer 112. The first end portion of the dielectric layer 116 may completely cover the first end portion of the first electrode layer 112. A second end portion of the first electrode layer 112 may extend beyond a second end portion of the dielectric layer 116. A first contact pillar 126 may be provided over the second end portion of the first electrode layer 112 thereby providing a connection to an input node. For example, the first contact pillar 126 may be laterally offset from the via 22 of the capacitor 128. The first contact pillar 126 provides an electrical connection to the first electrode layer 112 of the capacitor 128 on a surface of the inductor capacitor filter 108 thereby providing more options for circuit designers. The second electrode layer 118 and the metal fill layer 120 may extend over the dielectric layer 116 of the capacitor 128. The extension of the first electrode layer 112, the dielectric layer 116, the second electrode layer 118 and the metal fill layer 120 of the capacitor 128 over the top surface of the first insulating layer 106 provides advantages of increased capacitance value as well as providing an electrical connection to other devices or input nodes.

In some embodiments, the dielectric layer 116 may comprise a high dielectric constant and high energy band gap material including tantalum oxide ($Ta_2O_5$), hafnium oxide ($HfO_2$), zirconium oxide ($ZrO_2$), aluminum oxide ($Al_2O_3$), silicon nitride ($Si_3N_4$), other suitable high dielectric constant material or its combinations. The term "high dielectric constant material" may refer to a dielectric material with a dielectric constant of at least 7. The term "high energy band gap material" may refer to a dielectric material with a band gap of at least 4 electron volts (eV). In further embodiments, the dielectric layer 116 may be made of silicon dioxide, silicon nitride or silicon oxynitride. In one embodiment, the dielectric layer 116 may have a thickness range between 10 nm and 30 nm. The first insulating layer 106 may comprise a photosensitive polyimide (PSPI) layer, bisbenzocyclobutene (BCB) or polybenzoxazoles (PBO). An advantage of using a PSPI, BCB or PBO layer as the first insulating layer 106 is that it may be easily patterned like a photoresist layer.

The first electrode layer 112 may be made of tantalum nitride (TaN), titanium nitride (TiN), copper seed (Cu) or any other suitable metal liner materials. The second electrode layer 118 may be made of tantalum nitride (TaN), titanium nitride (TiN), copper seed (Cu) or any other suitable metal liner materials. In one embodiment, the first electrode layer 112 and the second electrode layer 118 may be made of the same materials. In other embodiments, the first electrode layer 112 and the second electrode layer 118 may be made of different materials.

The inductor 190 may be provided adjacent to the capacitor 128 and comprises a first metallization layer 138. A second metallization layer 152 may be provided over the first metallization layer 138. A second contact pillar 150 may connect the first metallization layer 138 and the second metallization layer 152. A magnetic core 160 may be provided between the first metallization layer 138 and the second metallization layer 152, whereby the magnetic core 160 is electrically insulated from the first metallization layer 138 and the second metallization layer 152 by the first insulating layer 106. In some embodiments, the inductor 190 may be a solenoid inductor. The first metallization layer 138, the second contact pillar 150 and the second metallization layer 152 may form a solenoid coil of the inductor 190.

A portion 166 of the second electrode layer 118 of the capacitor 128 and the metal fill layer 120 may extend over at least a portion of a top surface of the first insulating layer 106 to electrically connect with the second metallization layer 152 of the inductor 190. Dashed lines indicate an interface between the portion 166 of the metal fill layer 120 of the capacitor 128, the metal fill layer 120 of the capacitor 128 and the second metallization layer 152 of the inductor 190. A second metallization structure 156 may be provided below the first metallization layer 138 of the inductor 190, whereby the second metallization structure 156 may be connected to an input node. A second insulating layer 132 may be provided over the capacitor 128 and the inductor 190. Openings 136b and 136c in the second insulating layer 132 may expose a portion 158a of the metal fill layer 120 of the capacitor 128 and a portion 158b of the second metallization layer 152 of the inductor 190 respectively, for connection to a common input node. An opening 136a in the second insulating layer 132 may expose the first contact pillar 126. The second insulating layer 132 may comprise PSPI, BCB, PBO, or any other suitable insulating layers. In some embodiments, the first insulating layer 106 and the second insulating layer 132 may be made of the same material. In further embodiments, the first insulating layer 106 and the second insulating layer 132 may be made of different materials. In one embodiment, the first metallization structure 122 of the capacitor 128, and the first metallization layer 138 of the inductor 108 may be made of the same material, for example, the first metallization structure 122 and the first metallization layer 138 may be formed in the same process. In other embodiments, they may be formed of different electrically conductive materials in separate processes In yet another embodiment, the metal fill layer 120 of the capacitor 128, part of the second contact pillar 150, the second metallization layer 152 of the inductor 190 and the first contact pillar 126 of the capacitor 128 may be made of the same material in the same process, or may be formed from different electrically conductive materials in other embodiments. An example of a suitable conducting material may be copper (Cu).

Figure 1B:
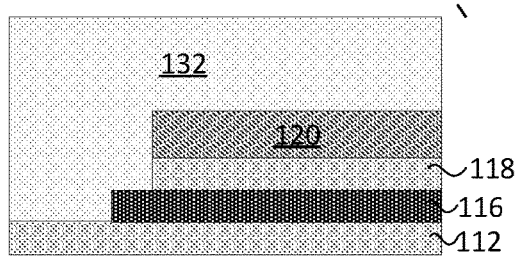
FIG. 1B is an exploded view of a portion of the capacitor, according to an embodiment of the disclosure.

FIG. 1B is an exploded view of a portion of the capacitor 128, according to an embodiment of the disclosure. Referring to FIG. 1B, the second end portion of the second electrode layer 118 and an end portion of the metal fill layer 120 may partially cover the second end portion of the dielectric layer 116.

FIG. 1C is a top view of an inductor capacitor filter 108, according to an embodiment of the disclosure. From a top-down perspective, the capacitor 128 may have a circular shape. In further embodiments, the capacitor 128 may have a polygonal shape. In some embodiments, the capacitor may have a substantially square or rectangular shape, where the corners may be substantially rounded due to processing effects. The capacitor 128 may be connected to the inductor 190 by the portion 166 of the metal fill layer 120, Dashed lines indicate an interface between the portion 166 of the metal fill layer 120, the portion 158a of the metal fill layer 120 of the capacitor 128 and the portion 158b of the second metallization layer 152 of the inductor 190. The second metallization structure 156 may be connected to the first metallization layer 138 of the inductor 190 and to an external input terminal.

FIG. 1D is a cross-section view of an inductor capacitor filter 108 taken along section line X-X' of FIG. 1C, according to an embodiment of the disclosure. FIG. 1D is subsequently used to illustrate a fabrication process flow for an inductor capacitor filter 108. In contrast to FIG. 1A, FIG. 1D does not show a portion 166 of a metal fill layer 120 connecting a capacitor 128 to an inductor 190, a second metallization structure 156 electrically connecting a first metallization layer 138 of the inductor 190 to a bond pad 192 of an underlying integrated circuit 110 and a portion 158b of the second metallization layer 152 of the inductor 190. The same reference numerals used in FIG. 1A are also used in FIG. 1C to refer to identical features.

Referring to FIG. 1D, the inductor capacitor filter 108 may be provided in the far BEOL layer. The inductor capacitor filter 108 comprises a capacitor 128 having a first electrode layer 112 arranged over sidewalls and a bottom surface of a via 22 in a first insulating layer 106 and is over at least a portion of a top surface of the first insulating layer 106. The via 22 is provided over a first metallization structure 122. A dielectric layer 116 may be arranged over the first electrode layer 112. A second electrode layer 118 may be arranged over the dielectric layer 116. A metal fill layer 120 may be arranged over the second electrode layer 118, whereby the metal fill layer 120 completely fills up the via. In an embodiment, a top surface of the metal fill layer 120 may be at least level with a top surface of the second electrode layer 118. In further embodiments, the top surface of the metal fill layer 120 may be higher than the top surface of the second electrode layer 118. An inductor 190 may be provided adjacent to the capacitor 128, whereby the inductor 190 may be electrically coupled to the capacitor 128. The inductor 190 and the capacitor 128 may be provided over an integrated circuit 110.

In some embodiments, the integrated circuit 110 may be of various technologies including, and not limited to, 55BCDLite, power management integrated circuit (PMIC), interactive voice response (IVR) circuit, power system on chip (PowerSoC). In other embodiments, the integrated circuit 110 may be of various technology nodes including, and not limited to, 22 nm, 40 nm and 130 nm technologies. The inductor capacitor filter 108 in the far BEOL layer is electrically connected to but does not interfere with the underlying metal layers of the integrated circuit 110.

Figure 1E:
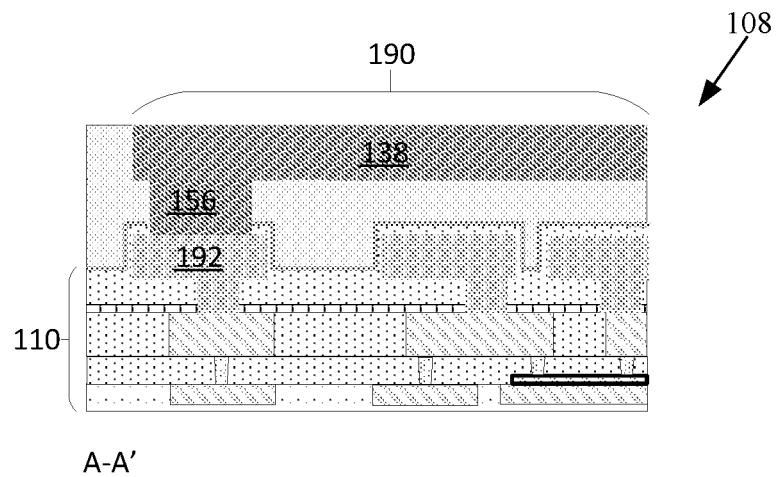
FIG. 1E is a cross-section view of a portion of an inductor capacitor filter taken along section line A-A' of FIG. 1C, according to an embodiment of the disclosure.

FIG. 1E is a cross-section view of a portion of an inductor capacitor filter 108 taken along section line A-A' of FIG. 1C, according to an embodiment of the disclosure. The cross-section view in FIG. 1E shows the second metallization structure 156 electrically connecting the first metallization layer 138 of the inductor 190 to a bond pad 192 of the underlying integrated circuit 110. Although not shown, the second metallization structure 156 may be connected to an input terminal.

Figure 1F:
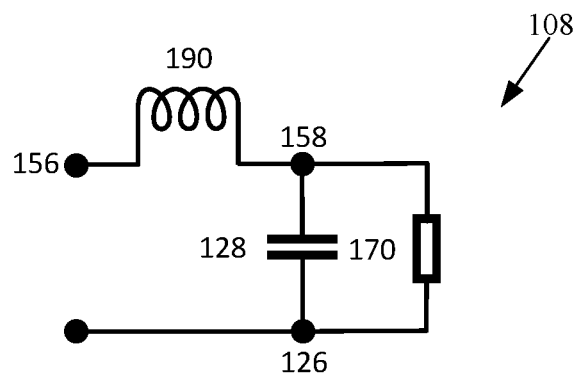
FIG. 1F is a circuit diagram of an inductor capacitor filter used as a low pass filter, according to an embodiment of the disclosure.

FIG. 1F is a circuit diagram of an inductor capacitor filter 108 used as a low pass filter, according to an embodiment of the disclosure. Referring to FIG. 1F, a node 158 may refer to either the portion 158a of the metal fill layer 120 of the capacitor 128 or the portion 158b of the second metallization layer 152 of the inductor 190. A load resistor 170 may be electrically connected to the node 158 and the first contact pillar 126 of the capacitor 128. The first contact pillar 126 of the capacitor 128 may be connected to a ground terminal. The second metallization structure 156 of the inductor 190 may be connected to an input terminal. The inductor capacitor filter 108 as connected may operate as a low pass filter.

Figure 1G:
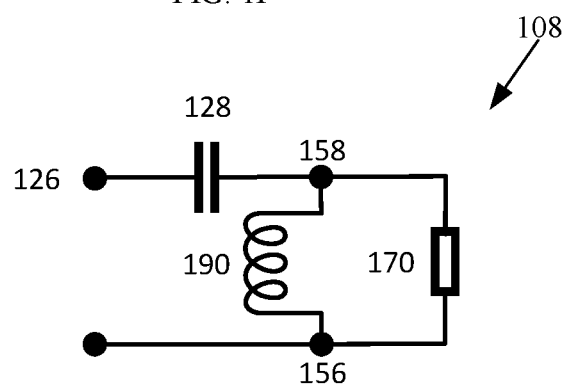
FIG. 1G is a circuit diagram of an inductor capacitor filter used as a high pass filter, according to another embodiment of the disclosure.

FIG. 1G is a circuit diagram of an inductor capacitor filter 108 used as a high pass filter, according to another embodiment of the disclosure. Referring to FIG. 1G, a load resistor 170 may be electrically connected to the node 158 and the second metallization structure 156 of the inductor 190. The second metallization structure 156 may be connected to a ground terminal. The first contact pillar 126 of the capacitor 128 may be connected to an input terminal. The inductor capacitor filter 108 as connected may operate as a high pass filter.

Figure 2:
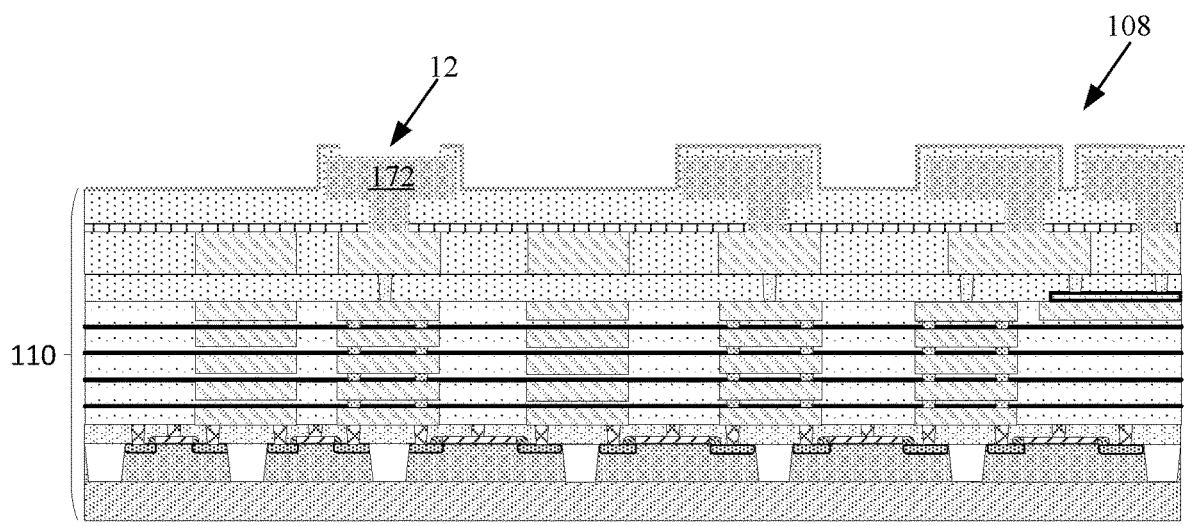
FIGS. 2 to 17 illustrate a fabrication process flow for an inductor capacitor filter, according to some embodiments of the disclosure.

FIGS. 2 to 17 illustrate a fabrication process flow for an inductor capacitor filter 108 shown in FIG. 1D, according to some embodiments of the disclosure. For simplicity, only an upper portion of the integrated circuit 110 is shown in FIGS. 3-17. FIG. 2 shows an integrated circuit 110 with an opening 12 formed in a passivation layer over a bond pad 172, according to some embodiments of the disclosure. Although not shown, an opening in a passivation layer may also be formed over the bond pad 192 shown in FIG. 1E. The opening 12 may be formed by patterning the passivation layer using conventional photolithography process and etching by depositing a photoresist layer over the passivation layer followed by exposure and developing to form a photoresist pattern. A wet etch or dry etch process may be used to remove portions of the passivation layer that is not covered by the photoresist pattern to thereby form the opening 12. The photoresist pattern may subsequently be removed.

Figure 3:
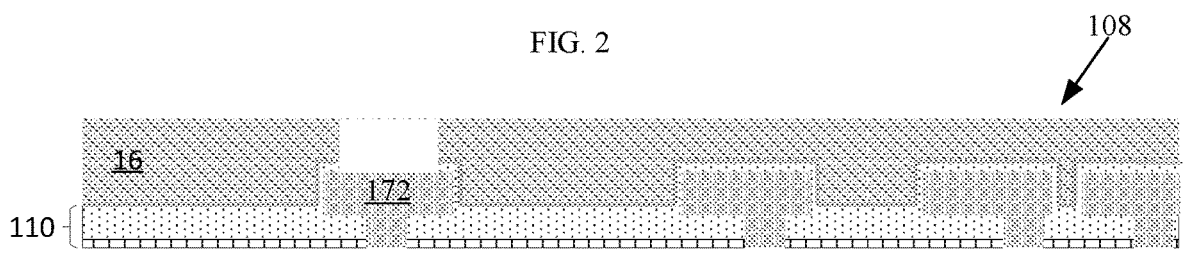

FIG. 3 is a partially completed inductor capacitor filter 108 after deposition and patterning of a photoresist layer 16 to expose the bond pad 172, according to some embodiments of the disclosure. The photoresist layer 16 may be deposited over an upper surface of the integrated circuit 110 and patterned by conventional photolithography process to form an opening over the bond pad 172.

Figure 4:
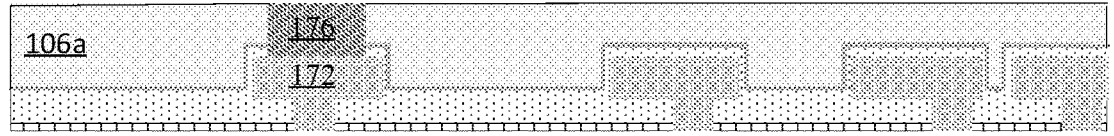

FIG. 4 is a partially completed inductor capacitor filter 108 after formation of a lower portion 176 of a first metallization structure 122 and a portion 106a of a first insulating layer 106, according to some embodiments of the disclosure. A suitable metallization material, for example, copper, may be deposited in the opening in the photoresist layer 16 over bond pad 172 by a suitable deposition method, for example, physical vapor deposition, followed by electroplating and photoresist lift-off. Although not shown, a layer of copper may also be formed over the photoresist layer 16. The photoresist layer 16 may subsequently be removed to leave behind a layer of copper over the bond pad 172 thereby forming the lower portion 176 of the first metallization structure 122. Although not shown, the second metallization structure 156 may also be simultaneously formed over the bond pad 192 shown in FIG. 1E. A first insulating layer 106, for example, a photosensitive polyimide (PSPI), may subsequently be deposited over the upper surface of the integrated circuit 110 and over the lower portion 176 of the first metallization structure 122 by coating and photo exposure and subsequently patterned with photo developing. A portion of the PSPI layer over the lower portion 176 of the first metallization structure 122 may be removed so as to expose a top surface of the lower portion 176. Another portion of the PSPI layer remains on the upper surface of the integrated circuit 110 and next to sidewalls of the lower portion 176 of the first metallization structure 122, thereby forming the portion 106a of the first insulating layer 106.

Figure 5:
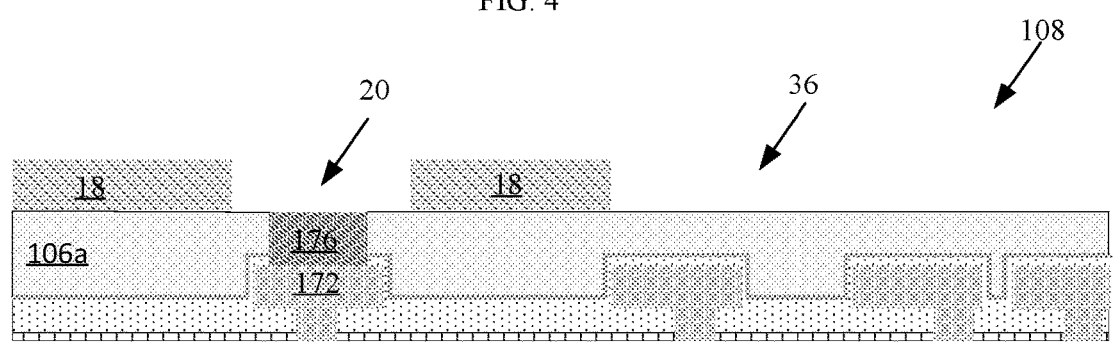

FIG. 5 is a partially completed inductor capacitor filter 108 after deposition and patterning of a photoresist layer 18, according to some embodiments of the disclosure. The photoresist layer 18 may be deposited over the portion 106a of the first insulating layer 106 and over the lower portion 176 of the first metallization structure 122 and subsequently patterned by conventional photolithography process to form an opening 20 exposing the lower portion 176 of the first metallization structure 122. An opening 36 may also be formed in the photoresist layer 18 exposing part of the portion 106a of the first insulating layer 106. The opening 36 may be a trench opening.

Figure 6:
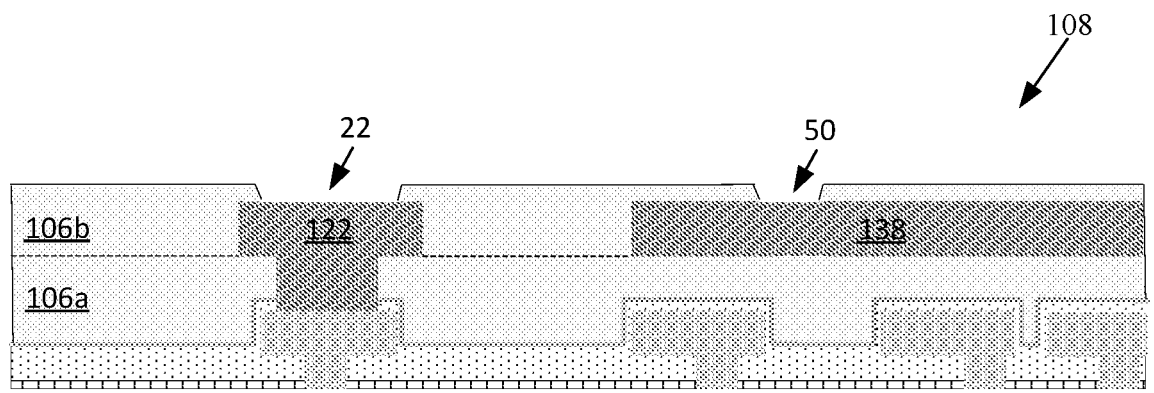

FIG. 6 is a partially completed inductor capacitor filter 108 after formation of a first metallization structure 122, a first metallization layer 138 and a portion 106b of the first insulating layer 106, according to some embodiments of the disclosure. A layer of suitable material such as copper may be deposited in the openings 20 and 36 in the photoresist layer 18 by electroplating. Although not shown, a layer of copper may also be formed over the photoresist layer 18. The photoresist layer 18 may subsequently be removed to leave behind a layer of copper over the lower portion 176 of the first metallization structure 122 and part of the portion 106a of the first insulating layer 106 thereby forming the first metallization structure 122 and the first metallization layer 138, respectively. Although not shown, the first metallization layer 138 may also be formed over the second metallization structure 156 shown in FIG. 1E simultaneously. A top surface of the first metallization layer 138 may be substantially level with a top surface of the first metallization structure 122. A layer of PSPI may subsequently be deposited over the portion 106a of the first insulating layer 106, the first metallization structure 122 and the first metallization layer 138 to thereby form the portion 106b of the first insulating layer 106. Part of the portion 106b of the first insulating layer 106 over the first metallization structure 122 and the first metallization layer 138 may be removed to form bottom portions of vias 22 and 50, respectively. A bottom surface of the via 22 may be substantially level with a bottom surface of the via 50.

Figure 7:
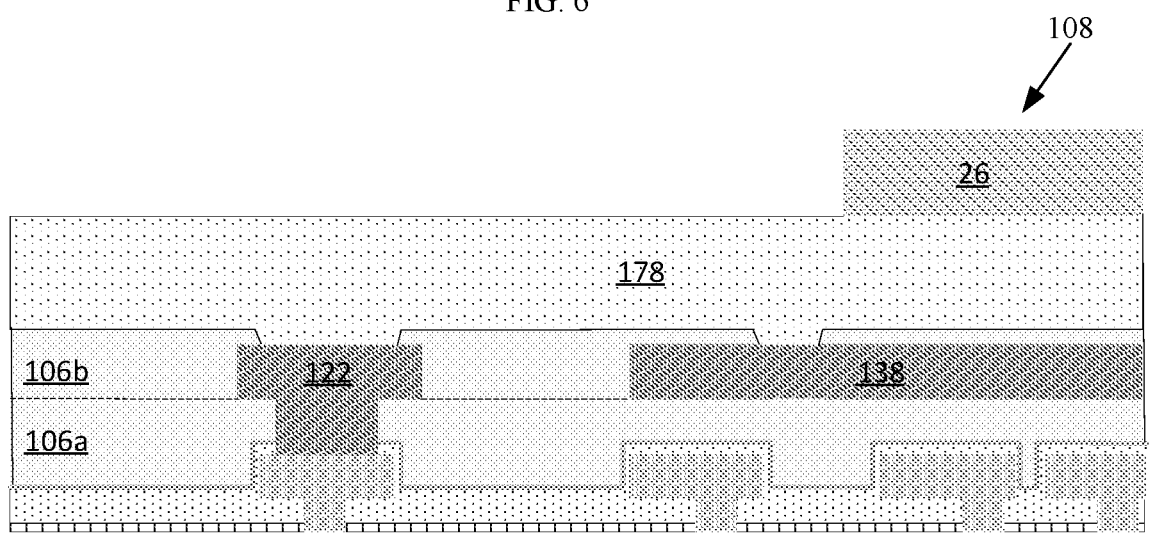

FIG. 7 is a partially completed inductor capacitor filter 108 after formation of a layer of magnetic material 178 and a photoresist layer 26 over the layer of magnetic material 178, according to some embodiments of the disclosure. The layer of magnetic material 178 comprises cobalt-based alloys, nickel-ferrite based alloys, or combinations thereof may be deposited over the portion 106b of the first insulating layer 106 by a suitable process such as physical vapor deposition or electroplating. The layer of magnetic material 178 may fill up the bottom portions of the vias 22 and 50 over the first metallization structure 122 and the first metallization layer 138, respectively. A layer of photoresist may be deposited and patterned by conventional photolithography process to form the photoresist layer 26 over a portion of the layer of magnetic material 178 next to the bottom portion of the via 50 and over the first metallization layer 138.

Figure 8:
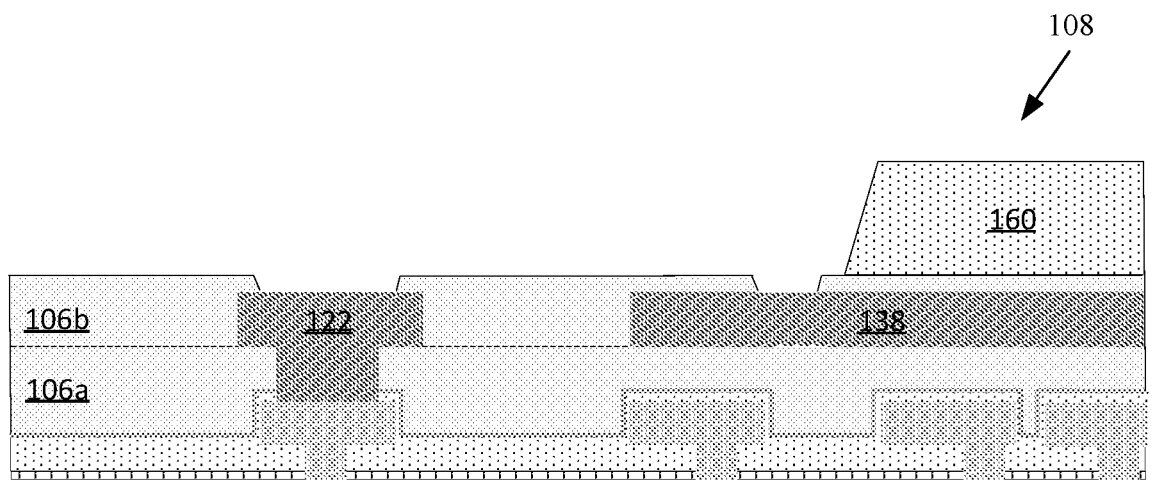

FIG. 8 is a partially completed inductor capacitor filter 108 after formation of a magnetic core 160, according to some embodiments of the disclosure. A wet etch or dry etch process may be used to remove a portion of the layer of magnetic material 178 not covered by the photoresist layer 26 leaving behind a portion of the layer of magnetic material 178 next to the bottom portion of the via 50 over the first metallization layer 138 thereby forming the magnetic core 160. The photoresist layer 26 may be removed.

Figure 9:
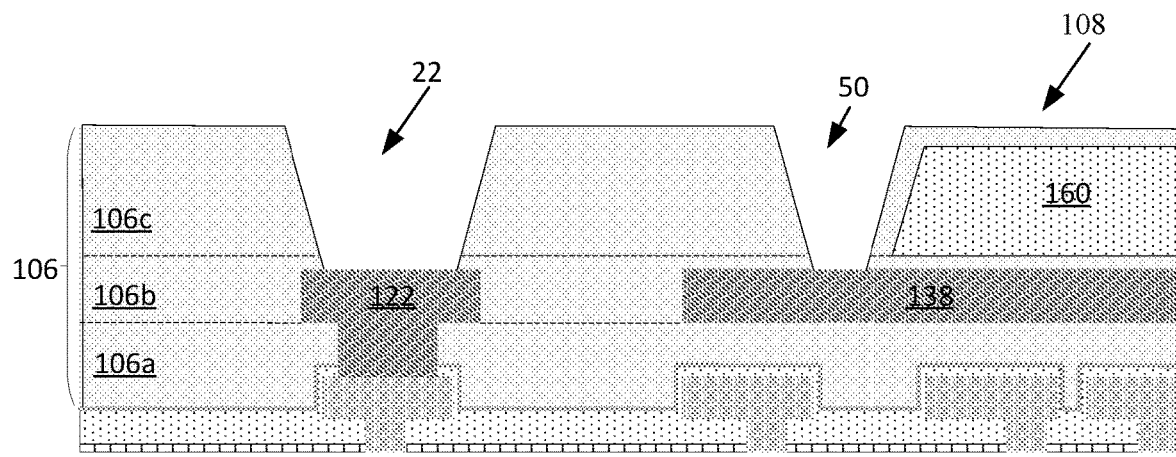

FIG. 9 is a partially completed inductor capacitor filter 108 after formation of a portion 106c of the first insulating layer 106 and vias 22 and 50 in the first insulating layer 106, according to embodiments of the disclosure. Referring to FIG. 9, a layer of PSPI may be deposited over the portion 106b of the first insulating layer 106 to form the portion 106c of the first insulating layer 106. Part of the portion 106c of the first insulating layer 106 over the first metallization structure 122 and the first metallization layer 138 may be removed to form vias 22 and 50, respectively, in the first insulating layer 106. The magnetic core 160 may be surrounded by the first insulating layer 106.

Figure 10:
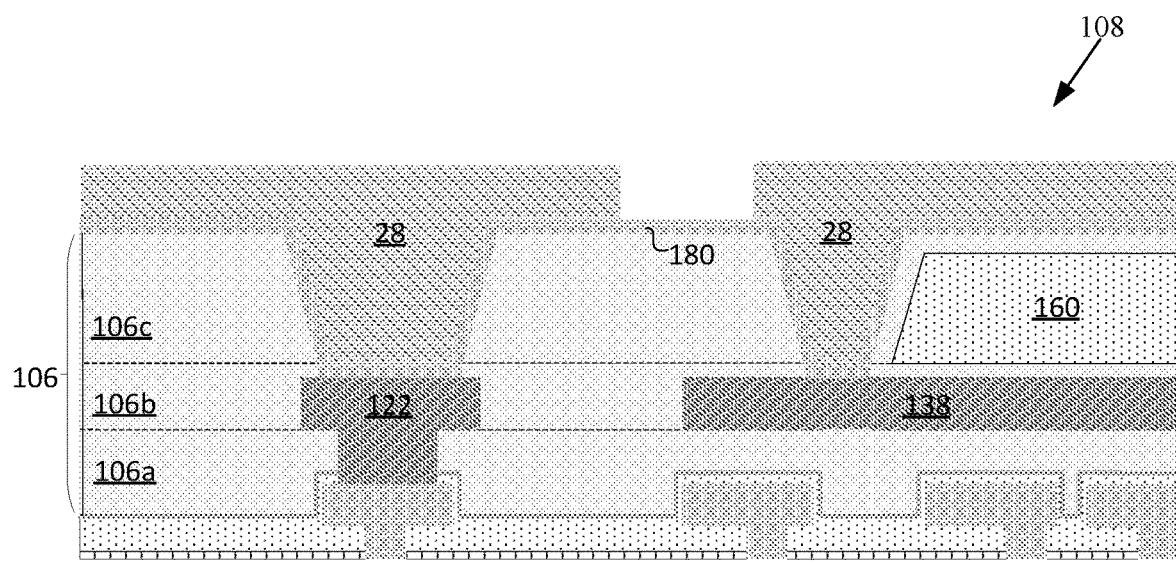

FIG. 10 is a partially completed inductor capacitor filter 108 after formation of a layer of suitable conducting material such as tantalum nitride (TaN) 180 and a photoresist layer 28, according to embodiments of the disclosure. A layer of TaN 180 may be deposited over sidewalls and bottom surfaces of the vias 22 and 50 and upper surfaces of the first insulating layer 106 by physical vapor deposition (PVD), atomic layer deposition (ALD), chemical vapor deposition (CVD), or any other suitable deposition processes. A layer of photoresist may be deposited over the layer of TaN 180 and patterned by conventional photolithography process to leave behind the photoresist layer 28 in the vias 22 and 50 and extending over at least an upper surface of the first insulating layer 106.

Figure 11:
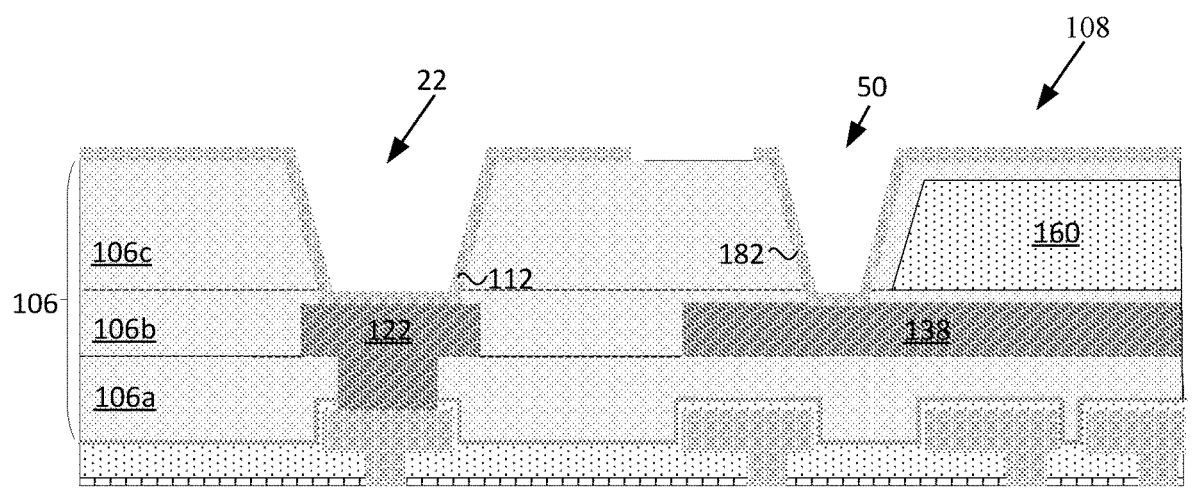

FIG. 11 is a partially completed inductor capacitor filter 108 after formation of a first electrode layer 112 and a barrier layer 182, according to embodiments of the disclosure. A portion of the TaN layer 180 not covered by the photoresist layer 28 may be removed from part of a top surface of the first insulating layer 106 by a wet etch or dry etch process to leave behind a portion of the TaN layer 180 over sidewalls and bottom surfaces of the vias 22 and 50 thereby forming the first electrode layer 112 and the barrier layer 182, respectively. The first electrode layer 112 and the barrier layer 182 may extend across at least over a top surface of the first insulating layer 106.

Figure 12:
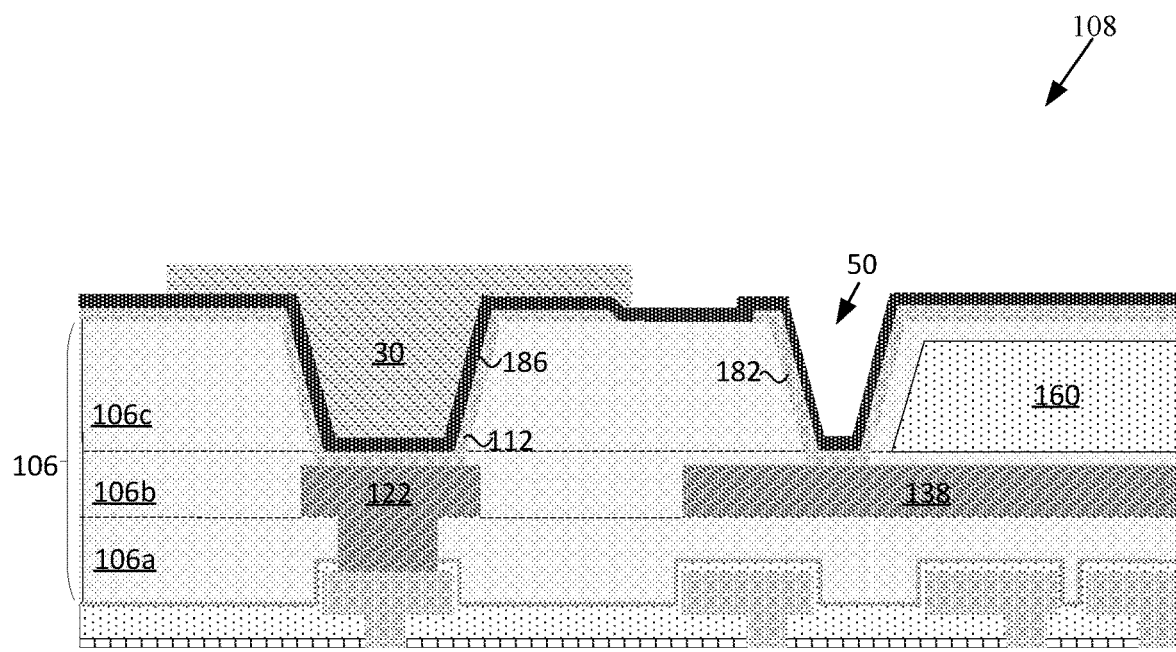

FIG. 12 is a partially completed inductor capacitor filter 108 after formation of a dielectric layer 186 and a photoresist layer 30, according to embodiments of the disclosure. A layer of high dielectric constant material may be deposited by ALD, PVD, CVD or any other suitable deposition processes over the first electrode layer 112, over the barrier layer 182 and over a top surface of the first insulating layer 106 to form the dielectric layer 186. A layer of photoresist may be deposited over the dielectric layer 186 and patterned by conventional photolithography process to form the photoresist layer 30 covering a portion of the dielectric layer 186 over the sidewalls and the bottom surface of the via 22 and over at least a top surface of the first insulating layer 106.

Figure 13:
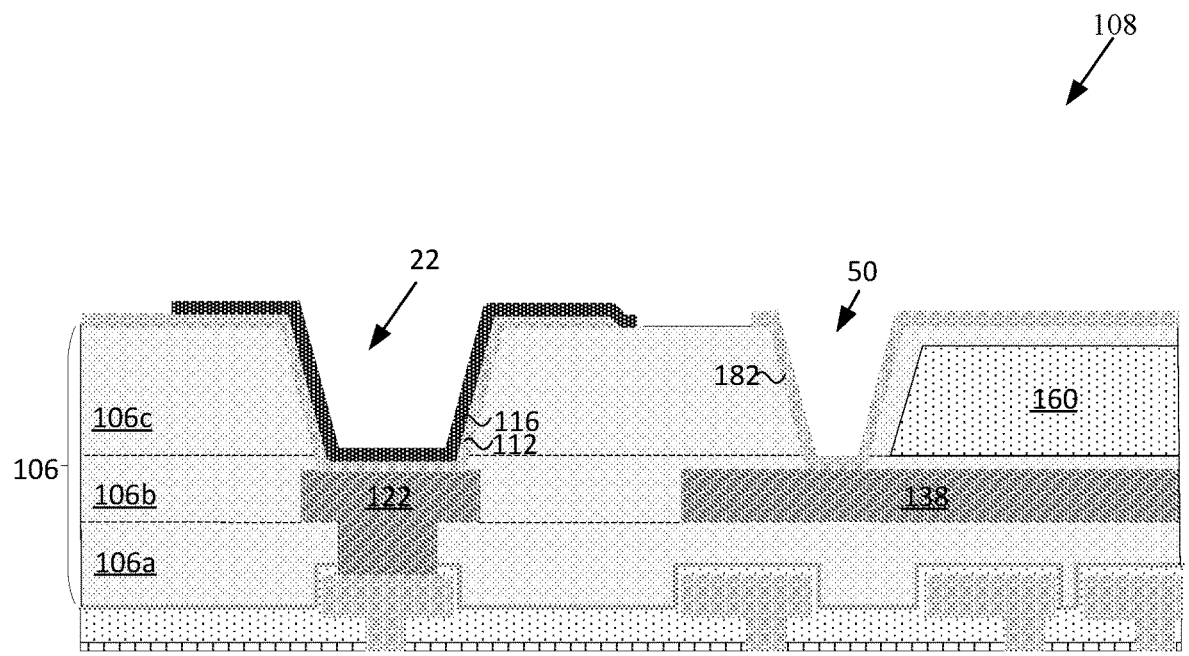

FIG. 13 is a partially completed inductor capacitor filter 108 after formation of a dielectric layer 116, according to embodiments of the disclosure. Portions of the dielectric layer 186 not covered by the photoresist layer 30 may be removed by a wet etch or dry etch process from a top surface of the first insulating layer 106 and the barrier layer 182 to leave behind a portion of the dielectric layer 186 over the first electrode layer 112 thereby forming the dielectric layer 116. Part of the first electrode layer 112 over a top surface of the first insulating layer 106 may also be exposed after the removal of the dielectric layer 186. The photoresist layer 30 may be removed after the etching process.

Figure 14:
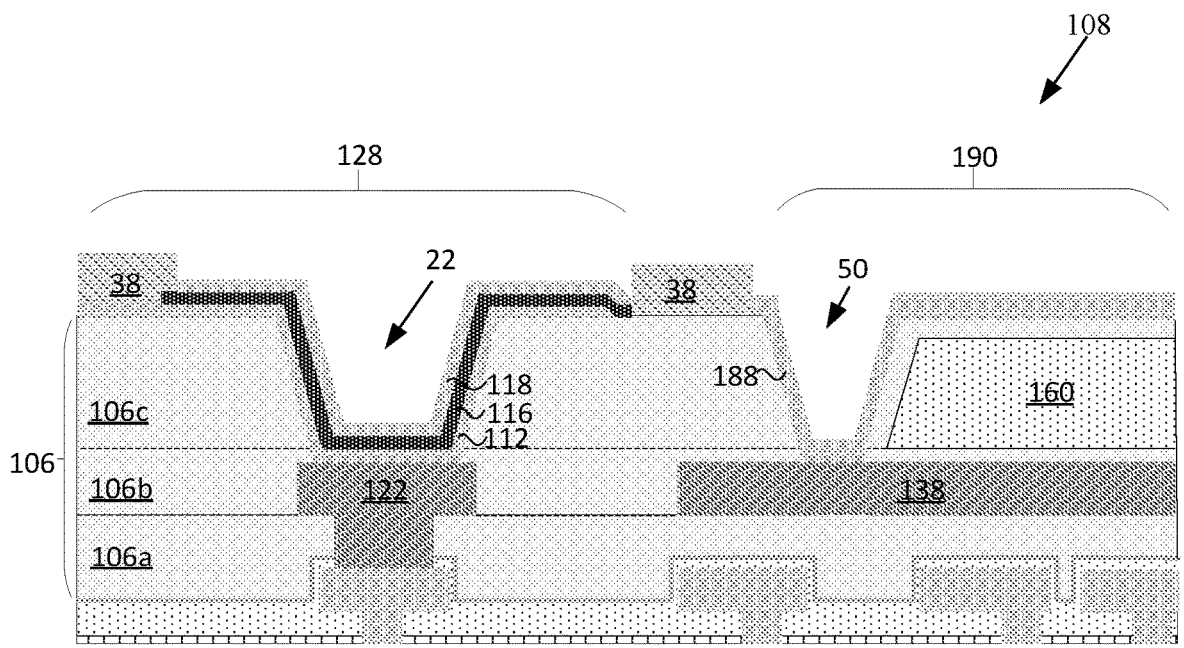

FIG. 14 is a partially completed inductor capacitor filter 108 after formation of a photoresist layer 38, a second electrode layer 118 and a barrier layer 188, according to embodiments of the disclosure. A layer of photoresist may be deposited over the first electrode layer 112, the dielectric layer 116, a top surface of the first insulating layer 106 and the barrier layer 182 and patterned by conventional photolithography process to form a photoresist layer 38 over the exposed part of the first electrode layer 112, over an end portion of the dielectric layer 116 and over the top surface of the first insulating layer 106. A layer of suitable conducting material such as TaN may be deposited by PVD, ALD or any other suitable process over the dielectric layer 116 and the barrier layer 182 thereby forming the second electrode layer 118 and the barrier layer 188, respectively.

Figure 15:
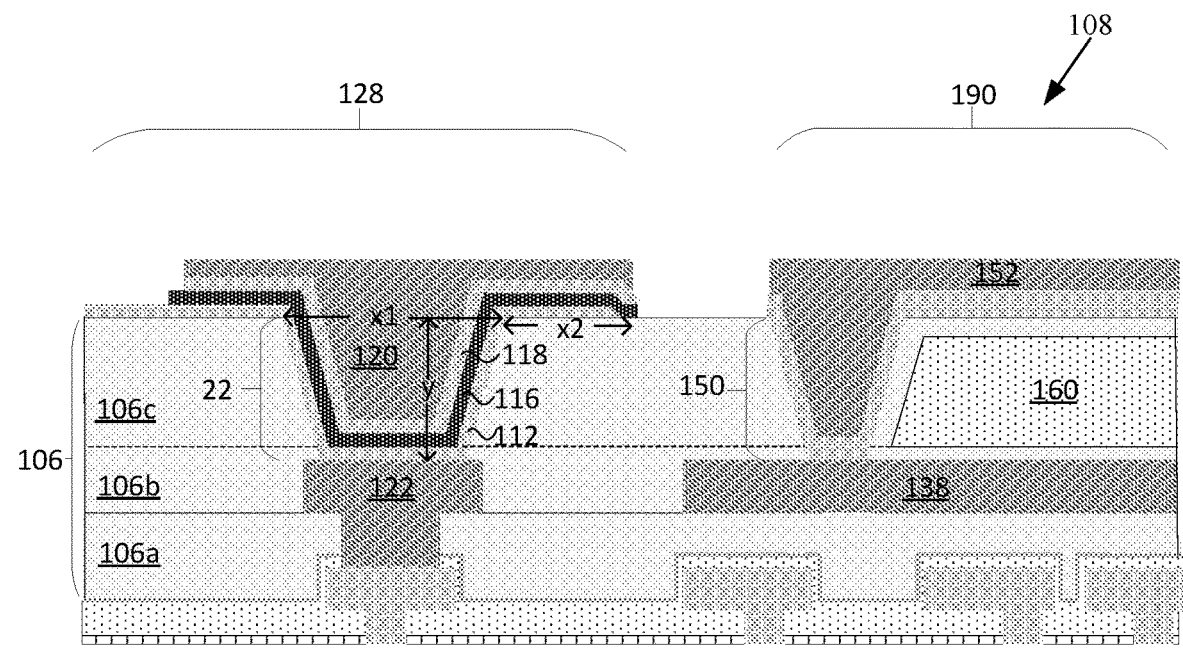

FIG. 15 is a partially completed inductor capacitor filter 108 after formation of a metal fill layer 120, a second contact pillar 150 and a second metallization layer 152, according to embodiments of the disclosure. A layer of suitable conducting material such as copper may be deposited by electroplating over the second electrode layer 118 and the barrier layer 188 to thereby form the metal fill layer 120, the second contact pillar 150 and the second metallization layer 152, respectively. The photoresist layer 38 may subsequently be removed. Although not shown, a portion 166 of the metal fill layer 120 and the second electrode layer 118 shown in FIGS. 1A and 1C may also be formed simultaneously.

Figure 16:
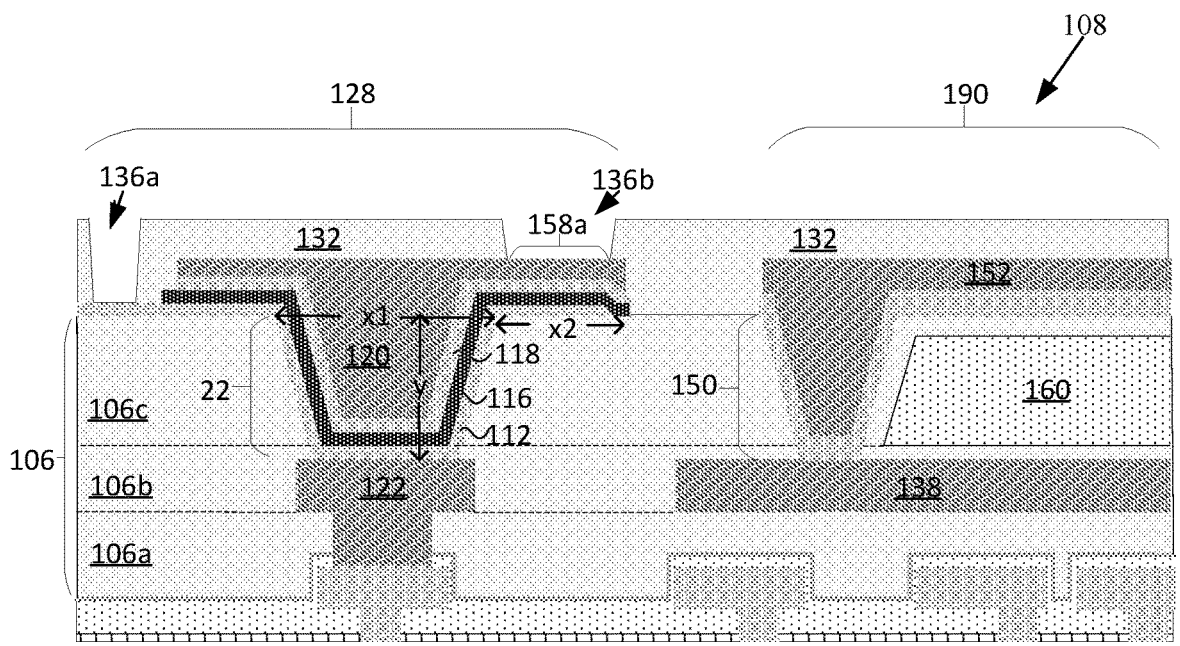

FIG. 16 is a partially completed inductor capacitor filter 108 after formation of a second insulating layer 132, according to embodiments of the disclosure. A layer of suitable insulating material such as PSPI may be deposited over the first electrode layer 112, the metal fill layer 120 of the capacitor 128, a top surface of the first insulating layer 106, and the second metallization layer 152 of the inductor 190 thereby forming the second insulating layer 132. Portions of the second insulating layer 132 over the exposed portion of the first electrode layer 112 and over the portion of the metal fill layer 120 extending over a top surface of the first insulating layer 106 may be removed to form openings 136a and 136b, respectively. Although not shown, an opening 136c in the second insulating layer 132 over the second metallization layer 152 of the inductor 190 as shown in FIG. 1A may also be formed simultaneously.

Figure 17:
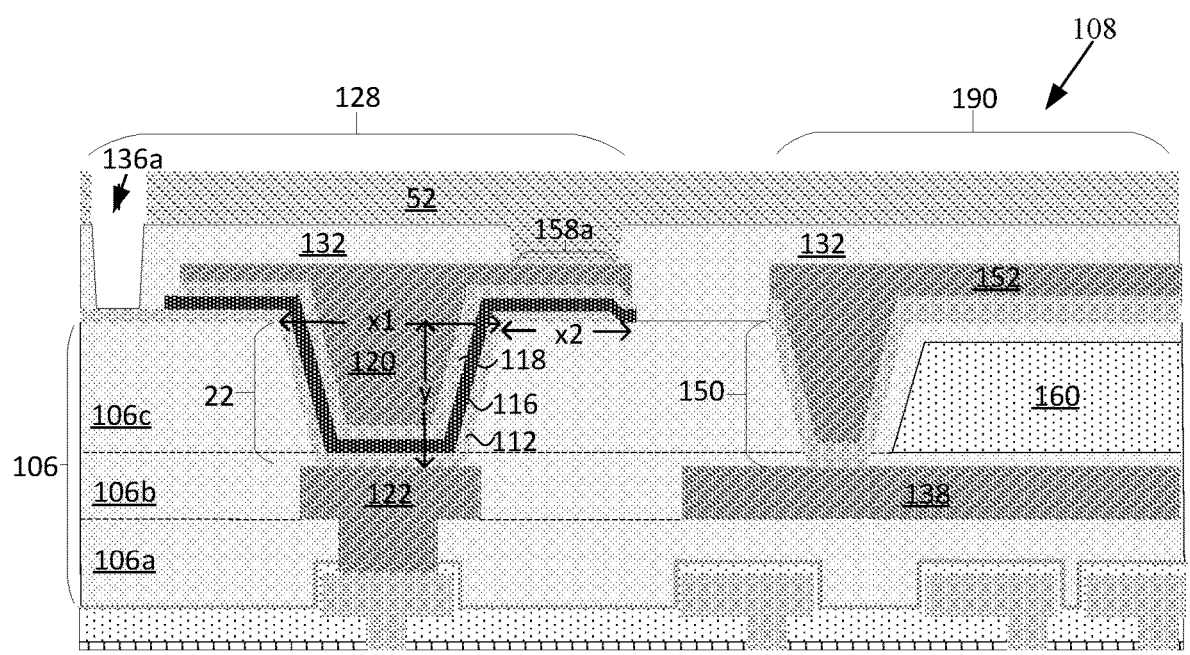

FIG. 17 is a partially completed inductor capacitor filter 108 after formation of a photoresist layer 52 over the second insulating layer 132, according to embodiments of the disclosure. The photoresist layer 52 may be deposited over the second insulating layer 132 and a portion of the photoresist layer 52 may be removed to expose the opening 136a. Although not shown, a layer of suitable conductive material such as copper may be deposited in the opening 136a and over the photoresist layer 52. The photoresist layer 52 may subsequently be removed to leave behind the coper layer in the opening 136a to thereby form the first contact pillar 126 and providing the inductor capacitor filter 108 as shown in FIG. 1D.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:
1. A semiconductor device comprising:
an inductor in a far back end of line (far BEOL) layer, the inductor comprises a first metallization layer, a second metallization layer over the first metallization layer, a contact pillar connecting the first metallization layer and the second metallization layer, and a magnetic core between the first and second metallization layers; and a capacitor adjacent to and electrically coupled to the inductor, wherein the capacitor comprises a first electrode layer arranged over sidewalls and a bottom surface of a via opening in a first insulating layer, a dielectric layer over the first electrode layer, a second electrode layer over the dielectric layer, and a metal fill layer over the second electrode layer, the metal fill layer having a top surface at least level with a top surface of the first insulating layer.

2. The semiconductor device of claim 1, wherein the first electrode layer, the dielectric layer and the second electrode layer of the capacitor extend over at least a portion of the top surface of the first insulating layer.

3. The semiconductor device of claim 2, wherein the top surface of the metal fill layer is higher than the top surface of the first insulating layer.

4. The semiconductor device of claim 1, wherein the first metallization layer, the second metallization layer and the contact pillar form a solenoid coil of the inductor, and wherein the magnetic core is electrically insulated from the first metallization layer and the second metallization layer by the first insulating layer.

5. The semiconductor device of claim 4, wherein the second electrode layer of the capacitor electrically connects with the second metallization layer of the inductor.

6. The semiconductor device of claim 4, further comprising:
a first metallization structure below the first metallization layer of the inductor, wherein the first metallization structure is connected to an input node.

7. The semiconductor device of claim 4, wherein the metal fill layer of the capacitor extends over at least a portion of the top surface of the first insulating layer to electrically connect with the second metallization layer of the inductor.

8. The semiconductor device of claim 4, wherein a bottom surface of the first electrode layer of the capacitor arranged over the bottom surface of the via opening in the first insulating layer is substantially level with a bottom surface of the Gccond contact pillar of the inductor.

9. The semiconductor device of claim further comprising:
a second insulating layer over the capacitor and the inductor;
an opening in the second insulating layer exposing a portion of the metal fill layer of the capacitor and the second metallization layer of the inductor for connection to a common input node.

10. The semiconductor device of claim further comprising:
a second metallization structure below the first electrode layer of the capacitor, wherein a top surface of the second metallization structure is substantially level with a top surface of the first metallization layer of the inductor.

11. A semiconductor device comprising:
an inductor in a far back end of line (far BEOL) layer, the inductor comprises a first metallization layer, a second metallization layer over the first metallization layer, a contact pillar connecting the first metallization layer and the second metallization layer, and a magnetic core between the first and second metallization layers; and
a capacitor adjacent to and electrically coupled to the inductor, wherein the capacitor comprises a first electrode layer arranged over sidewalls and a bottom surface of a via opening in a first insulating layer, the first electrode layer extends over at least a portion of a top surface of the first insulating layer, a dielectric layer over the first electrode layer, a second electrode layer over the dielectric layer, and a metal fill layer over the second electrode layer, the metal fill layer having a top surface at least level with a top surface of the second electrode layer over the first insulating layer.

12. The semiconductor device of claim 11, wherein the top surface of the metal fill layer is higher than the top surface of the second electrode layer over the first insulating layer.

13. The semiconductor device of claim 12, wherein the metal fill layer of the capacitor extends over at least a portion of the top surface of the first insulating layer to contact a second metallization layer of the inductor.

14. A method of fabricating a semiconductor device comprising:
forming an inductor in a far back end of line (far BEOL) layer, the inductor comprises a first metallization layer, a second metallization layer over the first metallization layer, a contact pillar connecting the first metallization layer and the second metallization layer, and a magnetic core between the first and second metallization layers; and
forming a capacitor adjacent to and electrically coupled to the inductor, wherein the formation of the capacitor comprises providing a first electrode layer arranged over sidewalls and a bottom surface of a via opening in a first insulating layer, providing a dielectric layer over the first electrode layer, providing a second electrode layer over the dielectric layer, and providing a metal fill layer over the second electrode layer, the metal fill layer having a top surface at least level with a top surface of the first insulating layer.

15. The method of claim 14, wherein the formation of the capacitor further comprises:
providing a second metallization structure, forming a first insulating layer over the second metallization structure and patterning the first insulating layer to form a via opening in the first insulating layer over the second metallization structure.

16. The method of claim 15, wherein
the second metallization structure of the capacitor and the first metallization layer of the inductor are formed from the same material.

17. The semiconductor device of claim 11, wherein the metal fill layer of the capacitor and the second metallization layer of the inductor have the same material.

18. The semiconductor device of claim 11, wherein the second electrode layer of the capacitor electrically connects with the second metallization layer of the inductor.

19. The semiconductor device of claim 11, further comprising:
a first metallization structure below the first metallization layer of the inductor, wherein the first metallization structure is connected to an input node.

20. The semiconductor device of claim 11, wherein the metal fill layer of the capacitor extends over at least a portion of the top surface of the first insulating layer to electrically connect with the second metallization layer of the inductor.

* * * * *